US006694282B2

United States Patent
Perner (10) Patent No.: US 6,694,282 B2
(45) Date of Patent: Feb. 17, 2004

(54) METHOD AND DEVICE FOR DETERMINING AN OPERATING TEMPERATURE OF A SEMICONDUCTOR COMPONENT

(75) Inventor: Martin Perner, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/105,878

(22) Filed: Mar. 25, 2002

(65) Prior Publication Data

US 2002/0173930 A1 Nov. 21, 2002

(30) Foreign Application Priority Data

Mar. 26, 2001 (DE) .......................... 101 14 825

(51) Int. Cl.[7] .............................................. G06F 17/40
(52) U.S. Cl. ................ 702/130; 219/497; 323/326; 327/512; 365/233; 702/132; 702/134
(58) Field of Search ................. 702/130, 132, 702/134; 364/557, 528.34; 365/233; 323/326; 326/121; 327/261, 262, 269, 276, 512; 324/763, 765

(56) References Cited

U.S. PATENT DOCUMENTS 4,039,928 A * 8/1977 Nofsker et al. ............. 323/326
5,890,100 A * 3/1999 Crayford .................... 702/130
6,078,208 A 6/2000 Nolan et al. ................ 327/512
6,329,642 B1 * 12/2001 Kaneko et al. ............. 219/497
6,560,164 B2 * 5/2003 Kawai et al. ............... 365/233

OTHER PUBLICATIONS

Brendecke, Dr. H., "Temperatur–Sensoren mit mikroprozessorlesbarem Ausgangssignal," Elektronik, vol. 20, Oct. 2, 1987, pp. 67–70 (partial translation provided).

* cited by examiner

Primary Examiner—John Barlow
Assistant Examiner—John Le
(74) Attorney, Agent, or Firm—Withrow & Terranova, PLLC (57) ABSTRACT

A method and a device determine an operating temperature of a semiconductor component during operation, wherein the semiconductor component has a PROM memory area which can be read from the outside. The device further has a programming device for programming the PROM memory area of the semiconductor component in which the operating temperature is obtained by interpolation in between a first calibration temperature value and a second calibration temperature value in dependence from an actual measurement. The device has a multivibrator for generating a measurement signal which has a measuring circuit and a driver circuit. The frequency of the measurement signal depends on the temperature of the measuring circuit in the semiconductor component. A frequency counter for senses the frequency of the measurement signal in a predefined measuring interval.

12 Claims, 4 Drawing Sheets

METHOD AND DEVICE FOR DETERMINING AN OPERATING TEMPERATURE OF A SEMICONDUCTOR COMPONENT

This application claims the benefit of German patent application DE10114825.9, currently pending, which is incorporated herein by reference in its entirety.

FIELD OF THE INVENTION

The invention relates to a method and device for determining an operating temperature of a semiconductor component during operation, the semiconductor component comprising a PROM memory area which can be read from the outside, and a programming device for programming the PROM memory area of the semiconductor component.

BACKGROUND OF THE INVENTION

In many semiconductor components it is important to determine the operating temperature. Thus, for example, when fabricating DRAMs precise knowledge of the junction temperature is highly significant for the planning and dimensioning of what is referred to as a guard band because the retention, and thus the determination of the refresh parameter depend on the junction temperature.

Sensors made of specific metals, doped semiconductors and alloys, from whose temperature-dependent resistance characteristic curve the temperature can be derived, are known for determining the operating temperature. Details on this can be found, for example, in Tietze Schenk, Halbleiter Schaltungstechnik [Semiconductor circuit technology], 9th edition 1991, chapter 26, Temperaturmessungen [Temperature measurements]. PT100, nickel-iron resistors or the platinum standard resistor are known as sensor types. Depending on the temperature range, the distinction is made between PTC thermistor sensors which cover the range between −100° C. and 200° C. and NTC thermistor sensors which cover the range between 1000° C. and 7000° C. During the fabrication of chips on a silicon base, the resistance characteristic curve of doped silicon is useful should one wish to measure the temperature on the chip. For silicon, the following is obtained as a relationship between the resistance and temperature $$R_\vartheta = R_{25} \cdot (1 + 7.95 \cdot 10^{-3} (\Delta\vartheta/° C.) + 1.95 \cdot 10^{-5} (\Delta\vartheta/° C.)^2)$$

$\vartheta$ being the temperature in ° C. and $\Delta\vartheta$ being measured with respect to 25° C., i.e. $\Delta\vartheta = \vartheta - 25°$ C.

In order to make the measurement of the sensor resistance independent of the line resistances, a four-wire resistance measurement is generally carried out. However, when the chip temperature is determined externally, it is not possible to conclusively determine the silicon temperature because it depends on the thermal resistance of the chip housing and has a finite (even if small) thermal resistance. For this reason, the operating temperature of the silicon (junction temperature) is several degrees higher than at the surface of the housing. In order to be able to conclusively determine the silicon temperature, the junction temperature of a diode operated with an off voltage or a base-emitter path can be used. Here, two pins which can be tapped by the housing of the test specimen are used if they are accessible and do not impede the operation of the component. An advantage of this method is the simple external access during the measurement of the junction temperature in the silicon, but a disadvantage is that an electrical preparation has to be carried out for each test specimen and this preparation is costly or in some cases even impossible if the chip package does not have any wiring (Bord-On Chip/µBGA Ball Grid Array/CSP Chip-Size Package). The measuring precision of the determination of the temperature is even often affected by loose contacts or thermal noise at the soldered connections, which is not compatible with a uniform, defined and largely disruption-free measuring specification for determining temperature.

In the RDRAM chip type from Rambus, for the first time a temperature sensor which is intended to test a limiting temperature and set a status bit at a specific threshold temperature was installed on a memory component. This switch-over point lies at approximately 90° C. and is intended to mark the limit of the thermal loading of the chip. In order to determine the threshold temperature, the sensor in the RDRAM operates using the band-gap reference voltage which in principle is precisely defined and can be used for precisely determining the temperature limit. In reality, owing to the process fluctuations, the threshold temperature can be predicted only with an accuracy of 10%, for which reason a subsequent 4-bit-resolution soft-fuse option must also be used for precisely setting the threshold temperature of the sensor. A disadvantage with this way of determining the threshold temperature is that it is only possible to measure the junction between two temperature ranges, but not the absolute temperature.

The object of the invention is to provide a method with which the silicon temperature (junction temperature) on a semiconductor component can be measured, and a combined analog/digital measuring/transducer circuit, designed for said method, for performing integrated analog/digital on-chip temperature measurement in a simple, fast and space-saving fashion.

This object is achieved by means of the method according to claim 1 and the device according to claim 4. Preferred embodiments of the invention are the subject matter of the subclaims.

SUMMARY OF THE INVENTION

The invention is based on the idea that the time constant of a multivibrator which is intentionally made temperature-dependent should be used to generate trigger pulses. The number of trigger pulses which is thus temperature-dependent in a defined time interval is used as a clock generator for a counting unit and is thus a measure of the temperature. The temperature can thus be defined within the framework of the intrinsic measuring accuracy in an unambiguous and defined fashion.

The method according to the invention for determining an operating temperature of a semiconductor component during operation, the semiconductor component comprising a PROM memory area which can be read from the outside, and a programming device for programming the PROM memory area of the semiconductor component, is characterized by the steps: a) generation of a first temperature in the semiconductor component, b) generation of a measurement signal by a multivibrator which comprises a measuring circuit and a driver circuit, the frequency of the measurement signal depending on the temperature of the measuring circuit in the semiconductor component, c) sensing of the frequency of the measurement signal in a predefined measuring interval by means of a frequency counter, d) storage of the sensed frequency in the PROM memory area of the semiconductor component by the programming device, e) repetition of the steps b) to d) at a second temperature so that the frequency sensed at the first temperature and the frequency sensed at the second temperature are stored in the PROM memory area of the semiconductor component. The two frequency values can be used as calibration points for any further determination of the temperature.

The predefined measuring interval is preferably between 1 and 2 ms long and is predefined by a reference frequency which is applied externally to the semiconductor component and which is not temperature-dependent.

In a preferred embodiment of the invention, in addition to the respective counter reading, the first temperature and the second temperature are stored in the PROM memory area of the semiconductor component.

The device according to the invention for determining an operating temperature of a semiconductor component during operation, the semiconductor component comprising a PROM memory area which can be read from the outside, and a programming device for programming the PROM memory area of the semiconductor component, is characterized by a multivibrator for generating a measurement signal which comprises a measuring circuit and a driver circuit, the frequency of the measurement signal depending on the temperature of the measuring circuit in the semiconductor component, and a frequency counter for sensing the frequency of the measurement signal in a predefined measuring interval. The measuring interval is predefined externally and is thus independent of the temperature.

The measuring circuit in the semiconductor component for measuring temperature preferably comprises at least one diode, one transistor and/or one silicon resistor which are distributed over the region of the circuit on the chip or are arranged at thermally critical points of the circuit on the chip.

The measuring circuit in the semiconductor component preferably has a linear temperature/resistance characteristic curve.

The measuring circuit of the multivibrator in the semiconductor component particularly preferably has a greater temperature-dependence than the driver circuit of the multivibrator, which in particular has no temperature-dependence or only slight temperature-dependence.

The advantages of the circuit according to the invention are manifold. The measurement of the temperature is independent of process fluctuations during the manufacture of the circuit and does not need to be trimmed. The current temperature can be called at all times (by means of mode register set functions for DRAMs) from the temperature sensor which is calibrated once during the fabrication. In this way, the junction temperature can be determined during the chip fabrication on the wafer, component and module level and in the application without a high level of expenditure on measurement. Installed in various types of a product range of semiconductor components, with the circuit according to the invention the thermal properties of the components can be assessed by means of a uniform measuring method in the same way over the entire product range and above all uniformly in terms of fabrication and application. In addition, the temperature can be read at any time from the chip, even within the pattern run, on chip packages which are difficult to access and in the standard application if an appropriately oriented controller chip supports the interrogation of the temperature.

Further advantages are that an on-chip solution on silicon is possible and a temperature measurement can be activated during the fabrication and during tests of the component and is possible during operation (specifically in the mode register set function in the case of DRAMs); the temperature can (possibly after binary conversion) be output directly in a clocked fashion via a module pin and read off; a temperature standardization during fabrication by means of fuses with defined reference temperatures does not require any band-gap reference setting.

For the invention, no additional A/D converter is required for converting the analog measuring signal (for example a voltage) because a multivibrator functions as a temperature-dependent counting pulse transmitter only a small amount of space is therefore required on the chip for the circuit according to the invention. Even a plurality of addressable sensors (RC elements/diodes) can be integrated for one chip.

Further features and advantages of the invention emerge from the following description of preferred embodiments in which reference is made to the appended drawings.

DETAILED DESCRIPTION OF THE PREFERRED EMBODIMENTS

Figure 1:
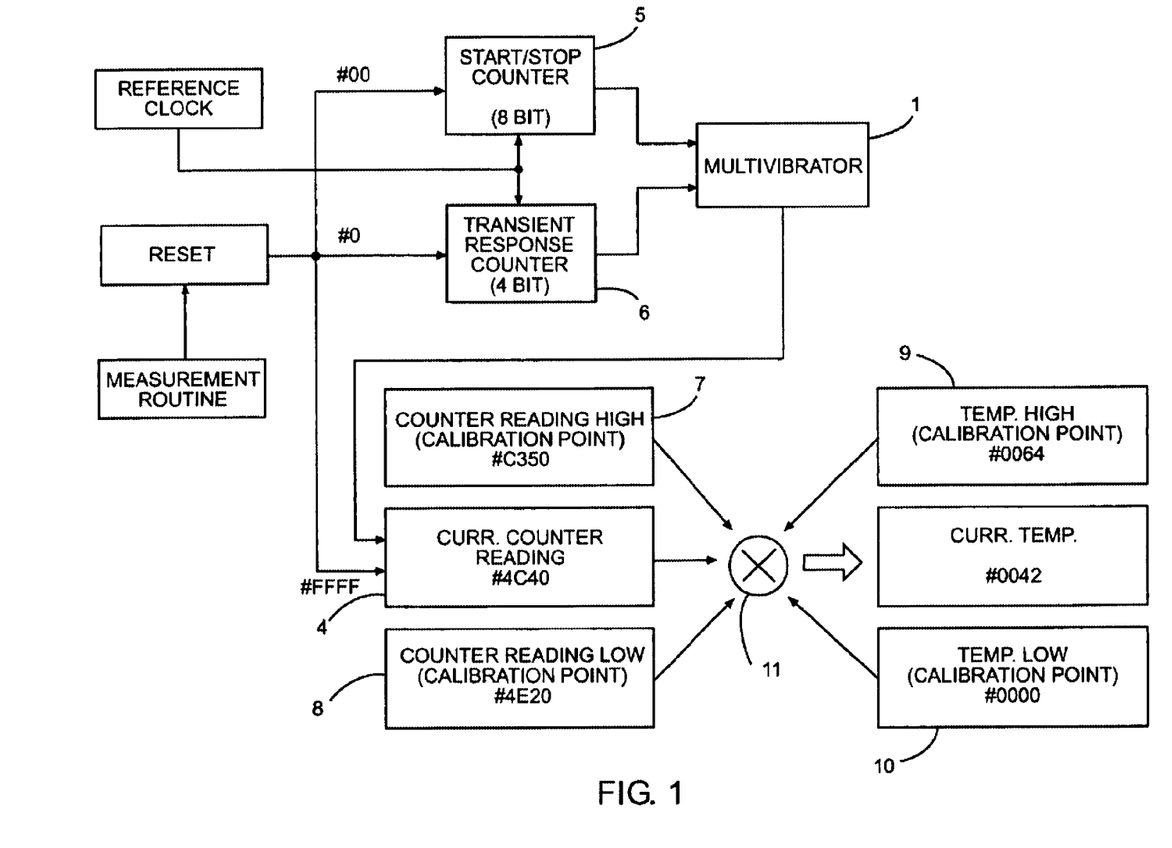
FIG. 1 shows a block diagram of the main components of an embodiment of the device according to the invention.

FIG. 1 illustrates the device for determining an operating temperature of a semiconductor component during operation. The semiconductor component comprises a PROM memory area which can be read from the outside. Unchangeable data of the semiconductor component, for example the type identification number of the semiconductor component or the like, is stored in this PROM memory area (referred to as fuse map). The semiconductor component comprises a programming device (not illustrated) for storing data in the PROM memory area or for programming the PROM memory area.

In many cases it is necessary to carry out an on-chip temperature measurement in the case of semiconductor components so that possible thermal overloading of the component can be avoided. For simple and fast measurement, the device according to FIG. 1 comprises a multivibrator 1 for generating a measurement signal. The measurement signal is sensed by a frequency counter 4. The basic design of the multivibrator 1 will be explained in more detail below with reference to FIG. 2. For the time being, the only significant factor is that the multivibrator 1 can be started and stopped by a start/stop counter 5 which is controlled from the outside (i.e. independently of temperature) so that the duration of the generation of the measurement signal can be predefined precisely from the outside by means of the multivibrator 1. The precision of the measurement period is determined here by the data width of the start/stop counter 5, and it is 8 bits in the present embodiment. In order to be independent of the fluctuations of the generation of the measurement signals in the starting phase when making precision measurements, in the embodiment illustrated in FIG. 1 the system waits for the transient response phase of the multivibrator 1, for which purpose a transient response counter 6 is provided (clocked from the outside independently of the temperature). The transient response counter 6 is configured in the illustrated embodiment in such a way that it waits up to 16 reference oscillations before the actual measurement of the temperature is permitted (it therefore has a width of 4 bits).

The counter reading of the frequency counter 4 can be stored in the PROM memory area which can be read from the outside. In the embodiment according to FIG. 1, two registers are provided for this, specifically a memory 7 for the "HIGH" counter reading, and a memory 8 for the "LOW" counter reading. The values stored in the memory 7 and 8 serve as a calibration point for the later measurements. These calibration points are determined and stored during the fabrication of the semiconductor component, which will be explained in more detail below with reference to FIGS. 3 and 4.

Furthermore, the embodiment of the device according to the invention in accordance with FIG. 1 comprises a further register 9 for storing the temperature, in which the "HIGH" counter reading has been stored. In other words, the "HIGH" temperature is stored in the register 9. In an analogous fashion, the "LOW" temperature for the "LOW" counter reading in the register 8 is stored in a further register 10 as a second calibration point.

In order to determine the currently prevailing temperature of the semiconductor component, when the measurement routine is called all the variable counters are set to zero or an initial value by a reset. The start/stop counter 5 is therefore set to #00 in a hexadecimal representation, the transient response counter 6 is set to #0 in a hexadecimal representation and the frequency counter 4 is set in a hexadecimal representation to, for example, the initial value #FFFF from which it then counts downward to #0000. The start/stop counter 5, and in this embodiment the transient response counter 6, is clocked by an external reference frequency so that the temperature stability of the two counters 5 and 6 is ensured.

After the multivibrator 1 is started by the start/stop counter 5 and after the transient response phase whose end is determined by the transient response counter 6 has expired, the frequency counter 4 begins to count until the multivibrator 1 is stopped by the start/stop counter 5 at the end of the measurement period. The temperature $T_{act}$ of the semiconductor component can then be determined from the counter reading then prevailing at the output of the frequency counter 4 and the values stored in the registers 7, 8, 9 and 10 by means of the equation $$T_{act} = \frac{HighTemp - LowTemp}{HighCounter - LowCounter}(ActCounter - LowCounter) + LowTemp$$

Here, "HighTemp" is the temperature calibration point stored in the memory 9, "LowTemp" is the temperature calibration point stored in the memory 10, "HighCounter" is the counter calibration point stored in the memory 7, "LowCounter" is the counter calibration point stored in the memory 8 and "ActCounter" is the counter reading present at the output of the frequency counter 4.

The current temperature of the semiconductor component is determined in an arithmetic unit 11 which is connected to the memories 7, 8, 9 and 10 and to the output of the frequency counter 4. The input variables of the arithmetic unit 11 are illustrated in FIG. 1 with simple arrows. The current temperature is present, for example as a hexadecimal number, at the output of the arithmetic unit 11. The output of the arithmetic unit 11 is represented as a double arrow.

As an example it would be assumed that the "HighTemp" temperature calibration point stored in the memory 9 will have the value 100° C., the "LowTemp" temperature calibration point stored in the memory 10 will have the value 0° C., the "HighCounter" counter calibration point stored in the memory 7 will have the value 50000, the "LowCounter" counter calibration point stored in the memory 8 will have the value 20000 and the value 40000 will be present at the output of the frequency counter 4 as the "ActCounter" counter reading. Then, the temperature Tact of the semiconductor component will be obtained according to the above equation as follows $$T_{act} = \frac{100° C. - 0° C.}{50000 - 20000}(40000 - 20000) + 0° C.$$
$$= 66.7° C.$$

The output value of the arithmetic unit is #0042 in this case. The actual temperature of the semiconductor component can thus be determined with the aforesaid counters and memories at any time.

Figure 2:
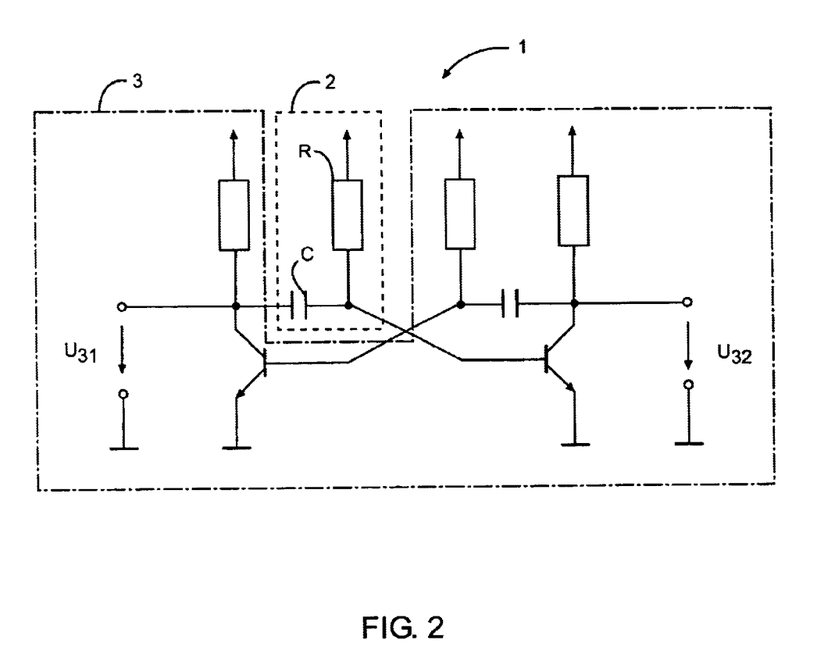
FIG. 2 shows the structure, known per se, of a multivibrator with an embodiment of the division according to the invention into internal measuring circuit and external driver circuit.

The basic structure of a multivibrator 1 which is known per se is shown in FIG. 2. The multivibrator 1 generates a signal with two switching times, one of the two frequencies being determined by the value of R and C. According to the invention, the multivibrator 1 is divided into a measuring circuit, which is represented as a dashed rectangle 2 in FIG. 2 and corresponds to the RC element, and a driver circuit which is represented as a dash-dot polygon 3 in FIG. 2 and corresponds to the rest of the multivibrator circuit. The measuring circuit 2 for measuring temperatures is arranged in close thermal contact with the semiconductor component so that the RC element is at the same temperature as the rest of the semiconductor component. In order to ensure the closest possible thermal contact between the measuring circuit 2 and the semiconductor component, the measuring circuit 2 is therefore integrated in particular in the semiconductor component.

The temperature of the semiconductor component is determined by sensing the temperature-dependent frequency of the multivibrator 1 which is determined by R and C in the measuring circuit 2. At the start of the measuring routine, the multivibrator 1 flips continuously at a predefined frequency which is specified by the RC time constant of the measuring circuit 2. In the embodiment according to FIG. 2, the measuring circuit 2 is represented with a conventional resistor R and a conventional capacitor C. However, the resistor R can be a silicon resistor in the semiconductor component, or instead a diode or a transistor can be used. In particular, a combination of a plurality of these elements is possible, which are distributed in particular over the surface of the semiconductor component on the chip in order to measure a temperature value which is representative of the semiconductor component. However, one or more elements can also be arranged at the thermally critical location or locations of the semiconductor component.

For simple calculation of the on-chip temperature, the measuring circuit 2 preferably has a linear temperature resistance characteristic curve. The RC time constant of the measuring circuit 2 is therefore a measurement variable which drops linearly as the temperature rises and which would reduce the oscillator frequency. In the temperature range from −50° C. to +150° C., the resistance of the silicon doubles approximately. If, instead of the resistor R, a diode which is operated in the switch-off direction is used, the temperature-dependence is given by the fact that the switch-off voltage in the aforesaid temperature range is typically reduced by the factor 2. Both sensor types could be used as on-chip sensors individually or in combination.

The capacitor C of the measuring circuit 2 is not necessarily integrated into the semiconductor component, it can also be arranged externally.

The multivibrator stage should not oscillate as a function of the temperature. However, because the driver circuit 3 contains real transistors and (line) resistors which also determine the oscillator frequency, it will also have a low linear frequency response. The driver circuit 3 therefore is preferably located outside the semiconductor component in order to be able to operate this part of the multivibrator 1 independently of the temperature of the semiconductor component. The driver circuit 3 is therefore referred to below as an external driver circuit 3. (However, it is apparent to a person skilled in the art that the driver circuit can also be integrated in the semiconductor component, the temperature-dependence of the measurement signal being then also influenced by the internal driver circuit, and the linearity between the temperature and the measurement signal frequency being thus possibly lost.) Arranging the external driver circuit 3 outside the semiconductor component ensures that the measuring circuit 2 of the multivibrator in the semiconductor component has a greater temperature-dependence than the external driver circuit 3 of the multivibrator. In other words, the discharge RC constant of the measuring circuit 2 of the multivibrator or the control voltage of a diode countervoltage source is dimensioned with a greater temperature-dependence than the transistors of the driver circuit 3 itself.

Figure 3:
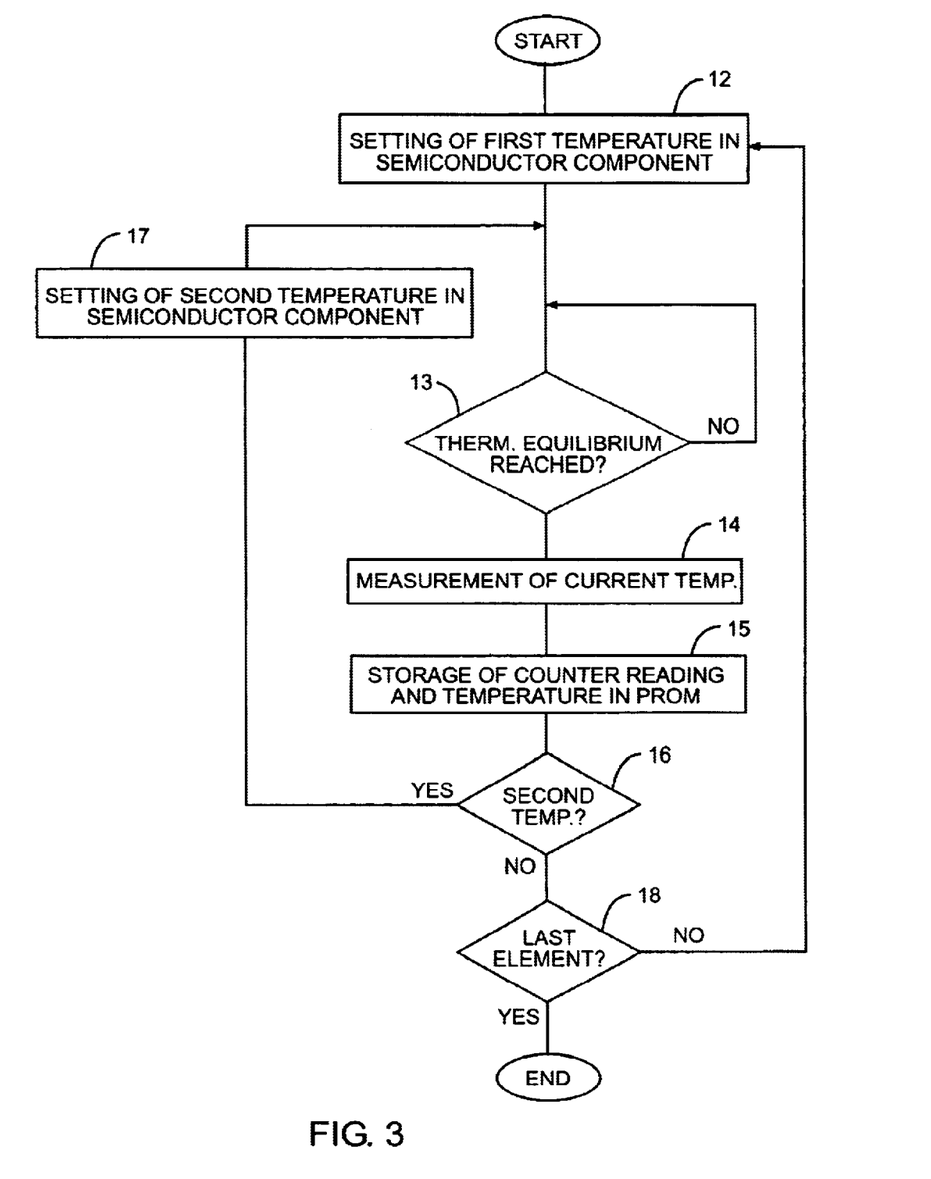
FIG. 3 shows the sequence of an embodiment of the method according to the invention as a flowchart.

The method for determining an operating temperature of a semiconductor component during operation is explained below with reference to FIGS. 3 and 4.

The determination of the temperature in order to calibrate the circuit during fabrication is carried out at the wafer level by means of a two-point calibration. Depending on the operating state, it is necessary to wait for several minutes until appropriate calibration of the silicon temperature is possible if the chips on the wafer are in thermal equilibrium. At the front end, this is possible without expending a large amount of time because the wafer rapidly reaches ambient temperature. The chip located in thermal equilibrium is initializd with a defined low temperature, room temperature or high temperature of the surroundings and a mean-value measurement of the temperature is subsequently carried out immediately by the current counter readings being permanently read out and externally averaged, The values which are determined are stored (fused) in the high and low registers as calibration points. After the calibration, both calibration points can output together with the current temperature result via the DQ pins during a measuring routine which can take place while the component is operating.

In other words, during the fabrication of the semiconductor component, a first temperature is set in the semiconductor component in a step 12. This setting, and all the further temperature settings, preferably take place in an oven (not illustrated) which permits a precisely defined temperature to be generated. The actual measurement, setting and initialization steps do not take place until it is determined, during a continuously executed interrogation 13, that a thermal equilibrium has been established in the oven and in the semiconductor component. When this thermal equilibrium prevails, the temperature of the semiconductor component is measured. The individual steps of this measuring routine are explained in more detail below with reference to FIG. 4. As has already been described above, the temperature measurement is based essentially on a frequency counting procedure. The corresponding value at the output of the frequency counter 4 in FIG. 1 is stored in the memories 7 and 9 as "HighCounter" counter calibration point or as "HighTemp" temperature calibration point after the temperature measurement in step 15. In step 16 it is determined whether a further value is to be measured and stored at a second temperature. If it is, in step 17 the second temperature is set in the oven and on the semiconductor component, and the steps 13 to 15 are repeated at this second temperature. The second values are stored as "LowCounter" counter calibration point in the memory 8 and as "LowTemp" temperature calibration point in the memory 10.

This measurement procedure is carried out for all the semiconductor elements of one batch and does not end until it is determined in step 18 that all the semiconductor components of this batch have been set with respect to the temperature measurement.

Figure 4:
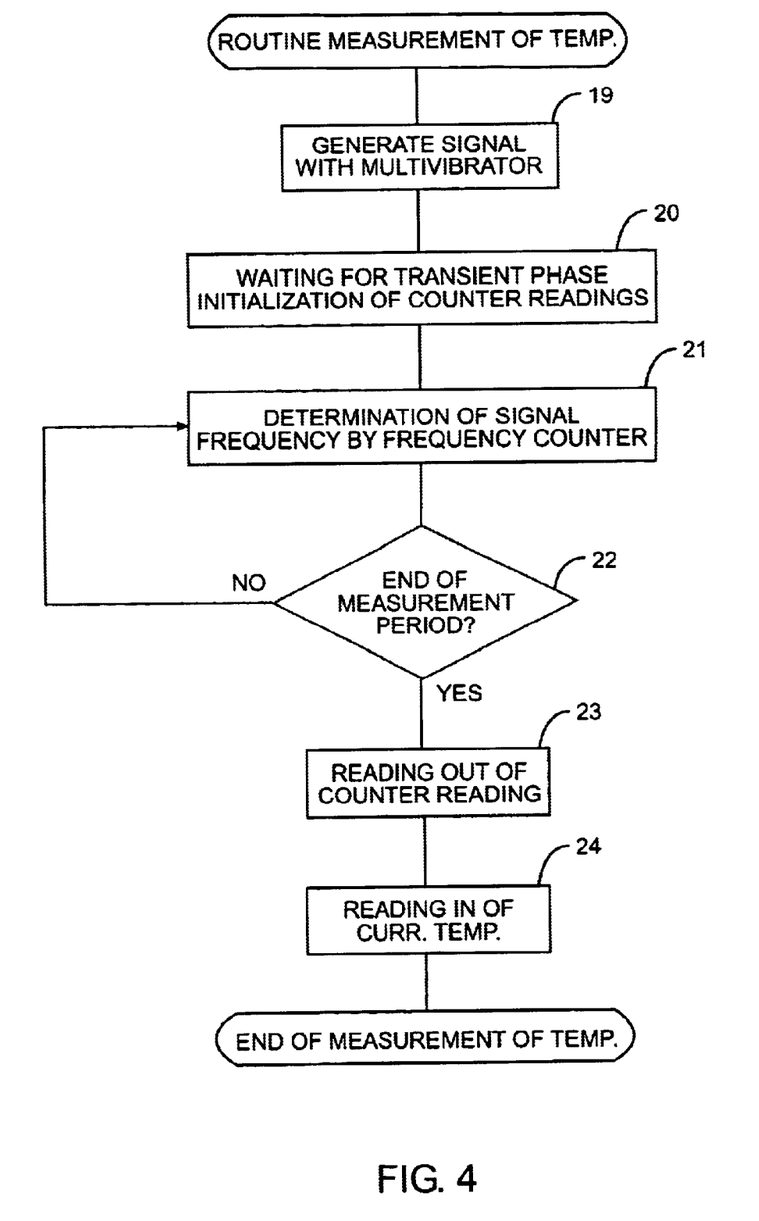
FIG. 4 shows the sequence of an embodiment of a subroutine of the method according to the invention as a flowchart.

FIG. 4 shows in particular the subroutine for measuring the temperature on the semiconductor component with the device according to FIG. 1. After the setting of the thermal equilibrium in the semiconductor component, which setting was determined in step 13, the measurement signal is generated by the multivibrator 1 in step 19. The frequency of the measurement signal depends on the temperature in the semiconductor component via the temperature-dependent value of the resistance R, and is sensed by the frequency counter 4 in a measurement interval predefined by the start/stop counter 5. However, before the frequency of the measurement signal is sensed by the frequency counter 4 in step 21, the system waits for the transient response period predefined by the transient response counter 6.

After the end of the measurement period, which is preferably between 1 and 2 ms long, has been detected in step 22, the counter reading of the frequency counter 4 is read out in step 23. In the embodiment of the method illustrated in FIG. 4, the temperature of the oven is additionally read in in step 24. Both the frequency sensed in step 23 and the temperature sensed in step 24 are stored in the PROM memory area 7, 8, 9 and 10 of the semiconductor component by the programming device in step 15.

The invention can therefore be used to unambiguously determine the temperature of the component within the scope of the intrinsic measurement precision. The measurement of the temperature is independent of process fluctuations, which is advantageous for the manufacturing process of the circuit. Subsequent trimming of the sensor is no longer necessary after the standardization which can take place automatically in the fabrication process. The current temperature can be called from the temperature sensor calibrated at the wafer level in the fabrication at any time, namely both during fabrication of the chip, on the wafer, component and module level, and in the application. This provides the possibility of being able to monitor various parameters uniformly and more satisfactorily by means of the junction temperature even during fabrication. For example, the burn-in temperature can be selectively set at the wafer level. This would be significant in particular for the 300 mm wafer fabrication and the monitoring of the temperature profiles in order to achieve a defined burn-in quality. Even with a calibration precision of 5%, no additional systematic measurement errors are caused during the internal temperature measurement. The outputting of the temperature and counter readings as digital values provides an enormous improvement in the reproducible and comparable determination of temperatures.

A quantitative example of the duration of the measuring routine will be given below. The measuring device is activated once for a specific measurement interval during the temperature measurement by a univibrator or start/stop counter. The temperature measurement lasts for approximately 1 to 2 ms. After each measurement, the current data is present in a register and can be read from the chip together with the calibration parameters. When there are three pairs of registers with 16 bits each, the outputting with a "single data rate" with a clock frequency of 100 MHz is 6·16·10 ns=9.6 µs. The pair of registers 7 and 9 contains the upper counter reading and the upper calibration temperature in each case as a binary-stored value, the register pair 8 and 9 contains the respective values for the lower calibration temperature, and the value of the currently prevailing temperature is determined from the current counter reading of the counter 4.

The invention is not restricted to the embodiments shown and described. For example, the driver circuits for the outputting of the data in the PROM memory area 7, 8, 9 and 10 can be configured in such a way that they can also be used to write data into the PROM memory area 7, 8, 9 and 10 from the outside. This data which is written into the register from the outside can be externally averaged counter values and calibration temperatures. The driver circuits are configured bidirectionally in this case.

List of References

1 Multivibrator comprised of driver circuit and measuring circuit
2 Measuring circuit of the multivibrator in the semiconductor component
3 Driver circuit of the multivibrator
4 Frequency counter
5 Start/stop counter (controlled by reference clock independently of the temperature)
6 Transient response counter (controlled by reference clock independently of the temperature)
7 Memory for "high" counter reading
8 Memory for "low" counter reading
9 Memory for "high" temperature value
10 Memory for "low" temperature value
11 Arithmetic unit
12 Setting of a first temperature in the semiconductor component
13 Checking of the thermal equilibrium in the semiconductor component
14 Measurement of the temperature in the semiconductor component at a given time
15 Storage of the sensed frequency in the prom memory area of the semiconductor component
16 Interrogation for 2nd measurement
17 Setting of a second temperature in the semiconductor component
18 Interrogation for further semiconductor components
19 Generation of a measurement signal by a multivibrator
20 Transient response phase of the multivibrator
21 Sensing of the frequency of the measurement signal by frequency counter
22 Iteration loop up to expiry of measurement period
23 Reading out of the counter reading
24 Reading in of the temperature

What is claimed is:

1. A method for determining an operating temperature of a semiconductor component during operation, the semiconductor component comprising a PROM memory area which can be read from the outside, and a programming device for programming the PROM memory area of the semiconductor component, in which said operating temperature is obtained by interpolation in between a first calibration temperature value and a second calibration temperature value in dependence from an actual measurement, comprising the steps for determining said first and second calibration temperature values:

a) generation of a first calibration temperature in the semiconductor component,
   b) generation of a measurement signal by a multivibrator which comprises a measuring circuit and a driver circuit, the frequency of the measurement signal depending on the temperature of the measuring circuit in the semiconductor component,
   c) sensing of the frequency of the measurement signal in a predefined measuring interval by means of a frequency counter,
   d) storage of the sensed frequency in the PROM memory area of the semiconductor component by the programming device, and
   e) repetition of the steps b) to d) at a second calibration temperature so that the frequency sensed at the first calibration temperature and the frequency sensed at the second calibration temperature are stored in the PROM memory area of the semiconductor component.

2. The method according to claim 1, wherein the predefined measuring interval lasts between 1 and 2 ms.

3. The method according to claim 2, further comprising storage of the first calibration temperature and of the second calibration temperature in the PROM memory area of the semiconductor component.

4. The method according to claim 1, further comprising storage of the first calibration temperature and of the second calibration temperature in the PROM memory area of the semiconductor component.

5. A device for determining an operating temperature of a semiconductor component during operation, the semiconductor component comprising a PROM memory area which can be read from the outside, and a programming device for programming the PROM memory area of the semiconductor component, in which said operating temperature is obtained by interpolation in between a first calibration temperature value and a second calibration temperature value in dependence from an actual measurement, comprising a multivibrator for generating a measurement signal which comprises a measuring circuit and a driver circuit, the frequency of the measurement signal depending on the temperature of the measuring circuit in the semiconductor component, and a frequency counter for sensing the frequency of the measurement signal in a predefined measuring interval.

6. The device according to claim 5, wherein the measuring circuit in the semiconductor component for measuring temperature comprises at least one diode, one transistor and/or one silicon resistor.

7. The device according to claim 6, wherein the measuring circuit in the semiconductor component has a linear temperature/resistance characteristic curve.

8. The device according to claim 6, wherein the measuring circuit of the multivibrator in the semiconductor component has a greater temperature-dependence than the driver circuit of the multivibrator.

9. The device according to claim 5, wherein the measuring circuit in the semiconductor component has a linear temperature/resistance characteristic curve.

10. The device according to claim 9, wherein the measuring circuit of the multivibrator in the semiconductor component has a greater temperature-dependence than the driver circuit of the multivibrator.

11. The device according to claim 5, wherein the measuring circuit of the multivibrator in the semiconductor component has a greater temperature-dependence than the driver circuit of the multivibrator.

12. A device for determining an operating temperature of a semiconductor component during operation, the semiconductor component comprising a PROM memory area which can be read from the outside, and a programming device for programming the PROM memory area of the semiconductor component, comprising a multivibrator for generating a measurement signal which comprises a measuring circuit and a driver circuit, the frequency of the measurement signal depending on the temperature of the measuring circuit in the semiconductor component, and a frequency counter for sensing the frequency of the measurement signal in a predefined measuring interval, wherein the measuring circuit of the multivibrator in the semiconductor component has a greater temperature-dependence than the driver circuit of the multivibrator.

* * * * *